United States Patent
Park

(10) Patent No.: US 8,421,177 B2
(45) Date of Patent: Apr. 16, 2013

(54) VERTICAL SILICON PHOTOMULTIPLIER WITH SUPERIOR QUANTUM EFFICIENCY AT OPTICAL WAVELENGTHS

(75) Inventor: Il Hung Park, Sungnam (KR)

(73) Assignees: Ewha University-Industry Collaboration Foundation, Seoul (KR); Sense Technology, Seoul (KR)

( * ) Notice: Subject to any disclaimer, the term of this patent is extended or adjusted under 35 U.S.C. 154(b) by 188 days.

(21) Appl. No.: 13/014,961

(22) Filed: Jan. 27, 2011

(65) Prior Publication Data

US 2012/0025340 A1 Feb. 2, 2012

(30) Foreign Application Priority Data

Jan. 29, 2010 (KR) .......................... 10-2010-0008215

(51) Int. Cl.
*H01L 31/08* (2006.01)
(52) U.S. Cl.
USPC ........................................................ 257/439

(58) Field of Classification Search .................. 257/439, 257/448, 431, 443
See application file for complete search history.

(56) References Cited

U.S. PATENT DOCUMENTS

2010/0148040 A1 * 6/2010 Sanfilippo et al. ......... 250/214.1

* cited by examiner

*Primary Examiner* — Bradley K Smith
(74) *Attorney, Agent, or Firm* — Jefferson IP Law, LLP

(57) ABSTRACT

The vertical silicon photomultiplier according to the present invention includes a trench electrode and a PN-junction layer perpendicular to the trench electrode forms and can maximize the quantum efficiency at optical wavelengths, 200~900 nm in such a way that: it generates electric fields horizontal thereto, by applying a reverse bias voltage to between the trench electrode and the PN-junction layer, so that, although ultraviolet light does not reach the PN-junction layer but is incident on the surface, electron-hole pairs can be produced by the horizontally generated electric fields although and an avalanche breakdown can be thus generated, and it allows ultraviolet light, capable of being transmitted to a relatively deep depth, to react with the PN-junction layer.

11 Claims, 5 Drawing Sheets

VERTICAL SILICON PHOTOMULTIPLIER WITH SUPERIOR QUANTUM EFFICIENCY AT OPTICAL WAVELENGTHS

PRIORITY

This application claims the benefit under 35 U.S.C. §119 (a) of a Korean patent application filed on Jan. 29, 2010 in the Korean Intellectual Property Office and assigned Serial No. 10-2010-0008215, the entire disclosure of which is hereby incorporated by reference.

BACKGROUND OF THE INVENTION

1. Field of the Invention

The present invention relates to photoelectron systems. More particularly, to a vertical silicon photomultiplier with superior quantum efficiency at optical wavelengths.

2. Description of the Related Art

In recent years, silicon photomultipliers (SiPMs) have developed to replace photomultipliers (PMTs). Silicon photomultipliers (SiPMs) are advantageous in that they are relatively small in size, low in operation voltage, for example, 25~100 V, and not affected by electric fields, compared with photomultipliers (PMTs). On the contrary, silicon photomultipliers (SiPMs) have a disadvantage in that their quantum efficiency is very low, less than 10%, with respect to ultraviolet light of wavelengths 200~400 nm. To resolve this problem, SiPM research is focused on maximizing the quantum efficiency in light of wavelengths 200~900 nm.

FIG. 1 is a cross-sectional view illustrating a general silicon photomultiplier. As shown in FIG. 1, the general silicon photomultiplier 100 is configured to include a substrate, an epitaxial layer 130 formed less than 5 μm thick on the substrate, and a PN-junction layer 120 formed in the epitaxial layer 130 by sequentially injecting P+ ions and N+ ions. In the epitaxial layer 130, relatively strong electric fields are generated. Incident light (photon) generates electron-hole pairs in the epitaxial layer 130. The electron-hole pairs are accelerated by strong electric fields in the epitaxial layer 130 and cause an avalanche breakdown, which amplifies an input signal. However, since the PN-junction layer 120 is formed parallel to the substrate 140 but electric fields are vertically generated perpendicular to the substrate 140, ultraviolet light 30 may have difficulty reaching the PN-junction layer 120 in the epitaxial layer 130. Therefore, the general silicon photomultiplier has low quantum efficiency. In addition, since the epitaxial layer 130 reacting to incident light is approximately 5 μm thick, the infrared light 20 is transmitted to a relatively deep depth of the silicon photomultiplier and does not have an opportunity to be activated with the layer. Therefore, the general silicon photomultiplier has low quantum efficiency.

SUMMARY OF THE INVENTION

An aspect of the present invention is to address the above-mentioned problems and/or disadvantages and to provide at least the advantages described below. Accordingly, an aspect of the present invention is to provide a vertical silicon photomultiplier that includes a trench electrode and a PN-junction layer perpendicular to the trench electrode forms and maximizes the quantum efficiency at optical wavelengths, 200~900 nm in such a way that: it generates electric fields horizontal thereto, by applying a reverse bias voltage between the trench electrode and the PN-junction layer, so that, although ultraviolet light does not reach the PN-junction layer but is incident on the surface, electron-hole pairs can be produced by the horizontally generated electric fields although and an avalanche breakdown can be thus generated; and it allows ultraviolet light, capable of being transmitted in to a relatively deep depth, to react with the PN-junction layer.

In accordance with an aspect of the present invention, a vertical silicon photomultiplier with superior quantum efficiency at optical wavelengths is provided. The multiplier includes a plurality of micro-pixels operated in a Geiger mode, a trench electrode placed around the micro-pixels, and a substrate on which the micro-pixels and the trench electrode are placed and part of which is exposed to an external environment and allows the plurality of micro-pixels and the trench electrode to be connected to the external environment. When a reverse bias voltage is applied between the trench electrode and the micro-pixels, horizontal electric fields are generated therebetween.

Preferably, the micro-pixels includes: a p-type conductive epitaxial layer; and a PN-junction layer vertically formed in the p-type conductive epitaxial layer.

Preferably, the PN junction layer includes: a p-type conductive layer; and an n+-type conductive layer placed outside the p-type conductive layer.

Preferably, the n+-type conductive layer is thicker by 2 μm than the p-type conductive layer.

Preferably, the PN junction layer is formed as one of a rectangular bar shape, a U-letter shape, and a V-latter shape.

Preferably, the PN junction layer is 10 μm high.

Preferably, the trench electrode is formed by depositing metal.

Preferably, the trench electrode is shaped in one of a square surrounding strip, a square edge, and a hexagonal edge.

Preferably, the trench electrode is 10~13 μm high.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will become more apparent from the following description taken in conjunction with the accompanying drawings, in which.

Throughout the drawings, it should be noted that like reference numbers are used to depict the same or similar elements, features, and structures.

BRIEF DESCRIPTION OF SYMBOLS IN THE DRAWINGS

Figure 1:
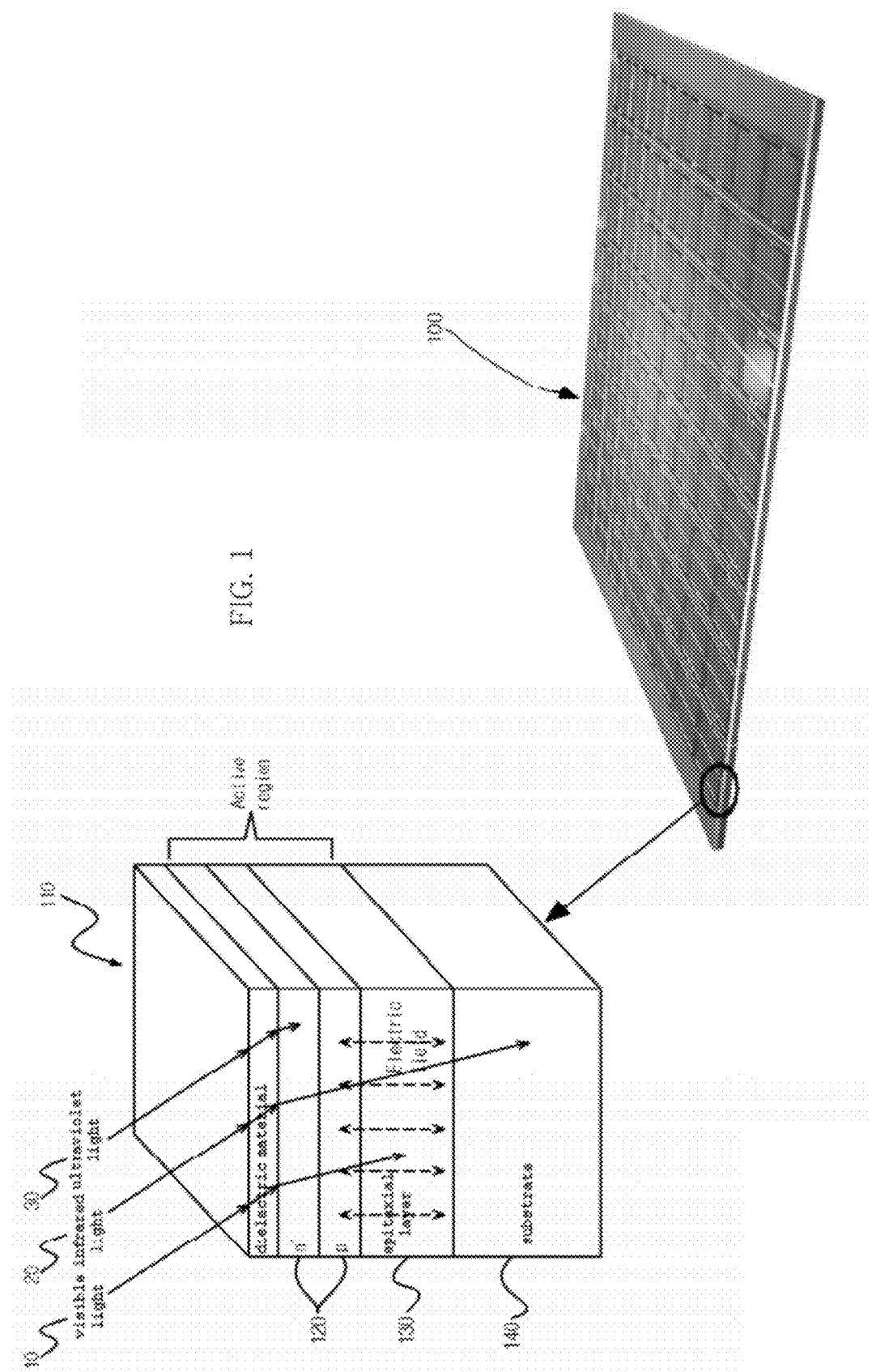
FIG. 1 is a cross-sectional view illustrating a general silicon photomultiplier according to an exemplary embodiment of the present invention.

10: visible light
20: infrared light
30: ultraviolet light
100: silicon photomultiplier
110: micro-pixel
120: PN-junction layer
130: epitaxial layer
140: substrate
200: substrate
300: epitaxial layer
400: PN-junction layer
410: n+-type conductive layer
420: p-type conductive layer
500: trench electrode
600: micro-pixel

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, detailed descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A silicon photomultiplier is a semiconductor photodiode including hundreds of to one thousand of micro-pixels. The silicon photomultiplier has a gain of 106 which is the same as the conventional photomultiplier (PMT). The dimension of each micro-pixel varies by 10~100 μm. The density of the micro-pixels is 100~1,000 micro-pixels/mm2. The micro-pixels operate by the common applying voltage and are coupled with others by a quenching resistor, respectively. The silicon photomultiplier outputs an output signal that is generated by adding the signals of all of the micro-pixels.

Figure 2:
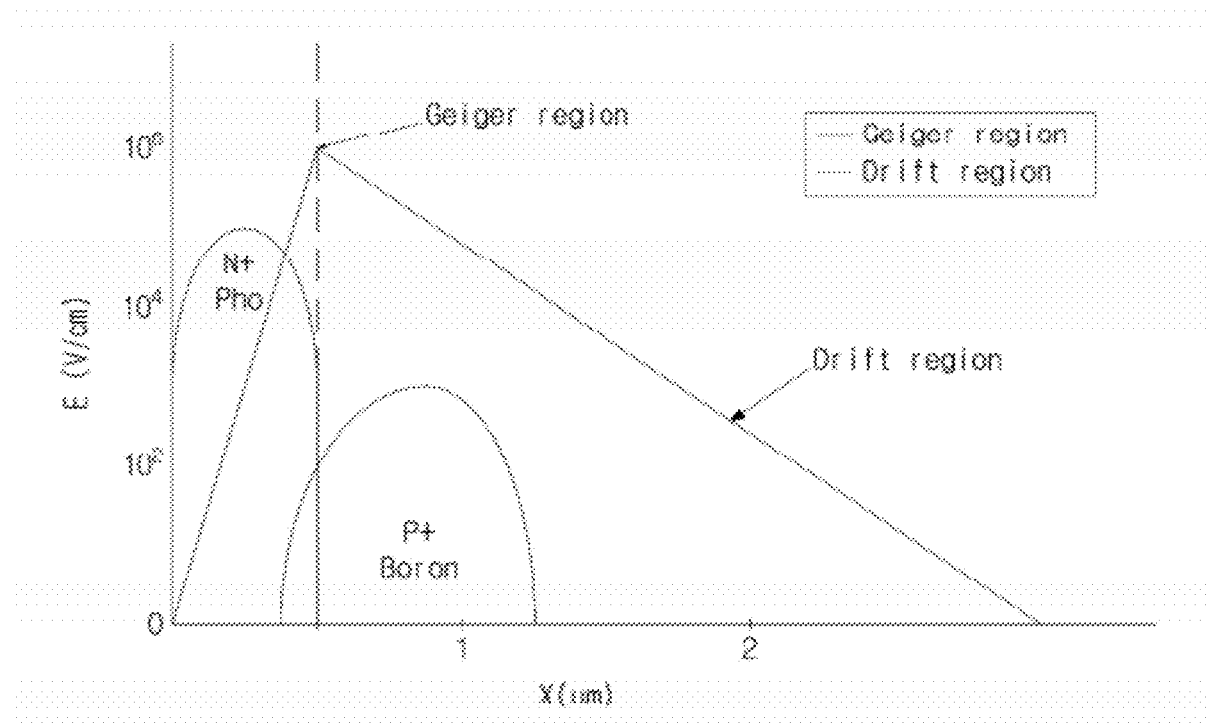
FIG. 2 is a graph of electric field distribution in an epitaxial layer of a silicon photomultiplier according to an exemplary embodiment of the present invention.

FIG. 2 is a graph of electric field distribution in an epitaxial layer of a silicon photomultiplier according to an exemplary embodiment of the present invention.

Referring to FIG. 2, when a voltage is biased to the silicon photomultiplier 100, a drift region of charges is formed by weak electric fields applied to a few μm depth from the substrate and a depletion region is also formed by very strong electric field in the PN-junction layer 120, i.e., between the p+ and n+ layers. When the depletion region has a potential corresponding to the operation voltage, Geiger mode breakdown is generated. When light is incident on the micro-pixels 110 serving as a sensor, photons generate an electron avalanche, i.e., breakdown, in the depletion region biased by strong electric field. In that case, the gain of current by one photon is 106.

Figure 3:
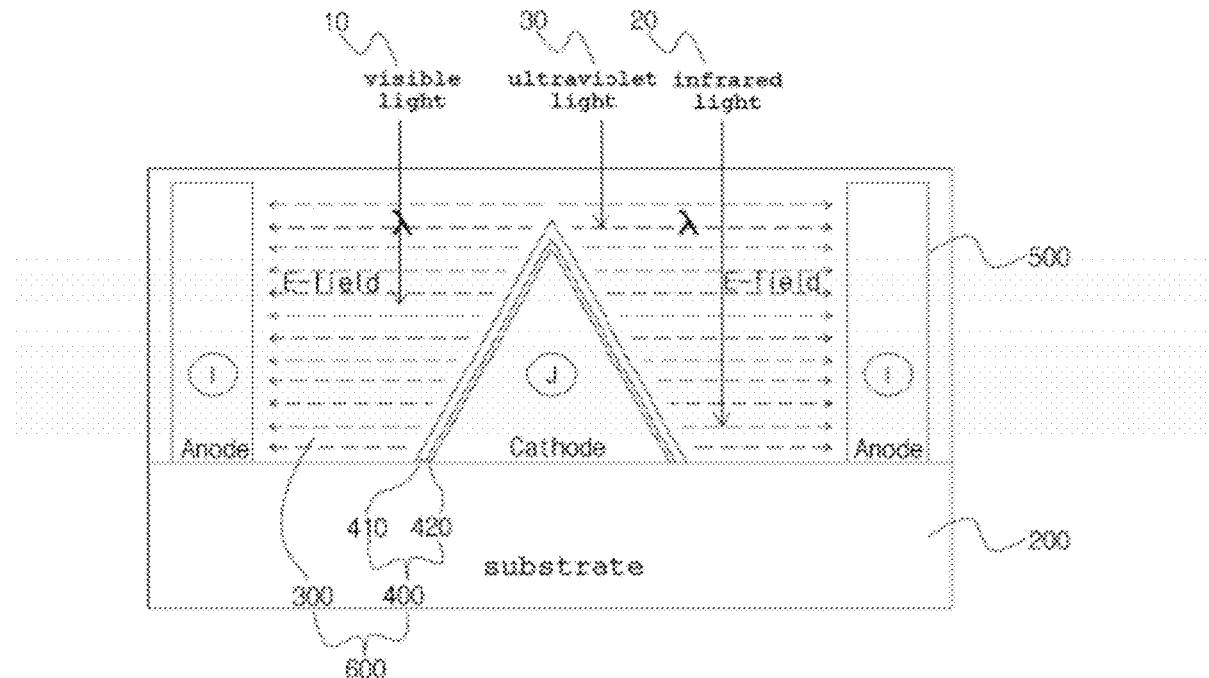
FIG. 3 is a cross-sectional view illustrating a first embodiment of a micro-pixel included in a vertical silicon photomultiplier according to an exemplary embodiment of the present invention.

FIG. 3 is a cross-sectional view illustrating a first embodiment of a micro-pixel included in a vertical silicon photomultiplier according to an exemplary embodiment of the present invention.

Referring to FIG. 3, the first embodiment of the vertical silicon photomultiplier 100 is configured in such a way that: a plurality of micro-pixels 600 is operated in the Geiger mode; a trench electrode 500 is placed around the micro-pixels 600; and a substrate 200 receives the micro-pixels 600 and the trench electrode 500 and has a portion, exposed to an external environment, for allowing the micro-pixels 600 and the trench electrode 500 to be connected to the external environment. When a reverse bias voltage is applied between the trench electrode 500 and the micro-pixels 600, horizontal electric fields are generated therebetween. If light is incident on the partially exposed substrate 200, electron-hole pairs are generated by the electric fields between the micro-pixels 600 and the trench electrode 500. The generation of electron-hole pairs causes the avalanche breakdown. Only if ultraviolet light 30 is incident on a depth close to the surface, it can react to the electric fields generated between the micro-pixels 600 and the trench electrode 500. Therefore, the vertical silicon photomultiplier 100 can be reacted with light of wavelengths, i.e., from the ultraviolet light 30 to the infrared light 20, thereby increase the quantum efficiency.

Referring to FIG. 3, the micro-pixel 600 is includes a p-type conductive epitaxial layer 300 and a PN-junction layer 400 vertically formed in the p-type conductive epitaxial layer 300. The vertical PN-junction layer 400 is placed in the p-type conductive epitaxial layer 300 reacting to incident light. Electric fields are generated in the p-type conductive epitaxial layer 300. In addition, the PN-junction layer 400 is formed perpendicular to the trench electrode 500. A reverse bias is applied to the trench electrode 500 and the PN-junction layer 400 to horizontally generate electric fields. Although ultraviolet light 30 does not reach up to the PN-junction layer 400 but is incident at a depth close to the surface, electron-hole pairs are generated by electric fields generated between the trench electrode 500 and the PN-junction layer 400 to produce an avalanche breakdown. In addition, when infrared light 20 is incident at a relatively deep depth, it reacts to the electric fields in the PN-junction layer 400. Therefore, the quantum efficiency is incased at wavelengths (for example 200~900 nm).

Referring to FIG. 3, the PN-junction layer 400 is configured to include a p-type conductive layer 420 and n+ type conductive layer 410 placed on the outer side of the p-type conductive layer 420. The PN-junction layer 400 generates very strong electric fields between the p-type conductive layer 420 and the n+ type conductive layer 410, including the p-type conductive layer 420 and the n+ type conductive layer 410, thereby a thin depletion region. When the depletion region is biased by the operation voltage, Geiger mode breakdown may occur.

Referring to FIG. 3, the PN-junction layer 400 is implemented in such a way that the n+ type conductive layer 410 is thicker by 2 μm than the p-type conductive layer 420. This is to reduce noise in the sensor.

Figure 4:
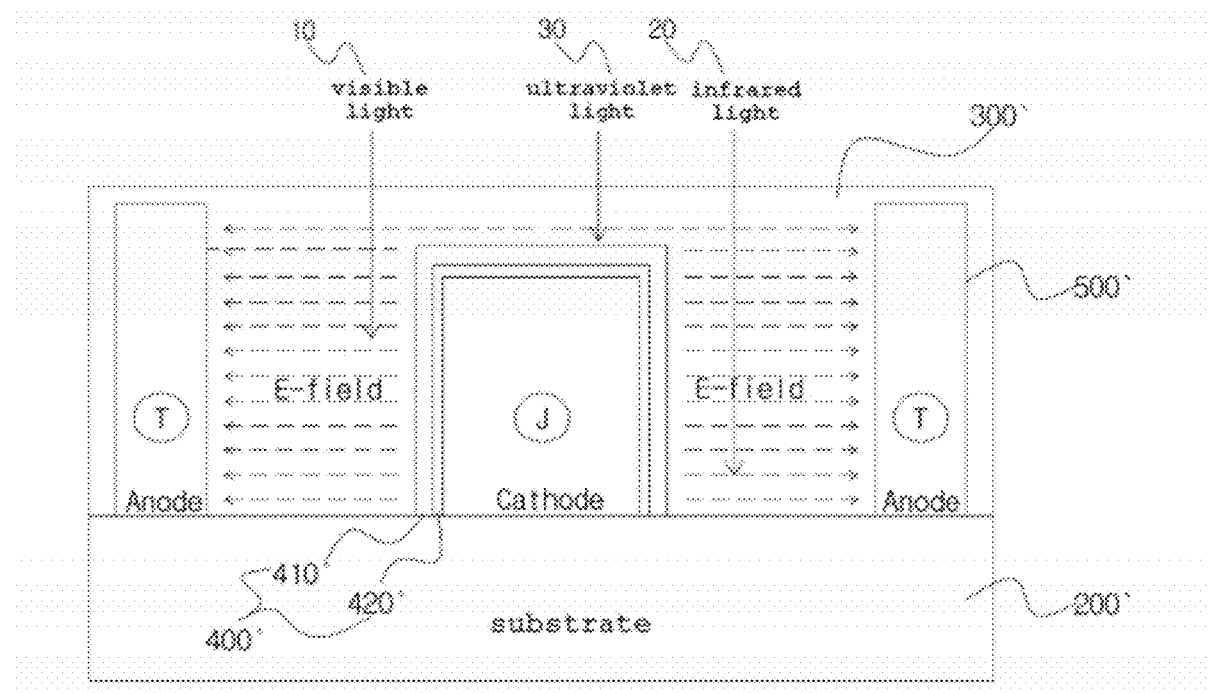
FIG. 4 is a cross-sectional view illustrating a second embodiment of a micro-pixel included in a vertical silicon photomultiplier according to an exemplary embodiment of the present invention.
Figure 5:
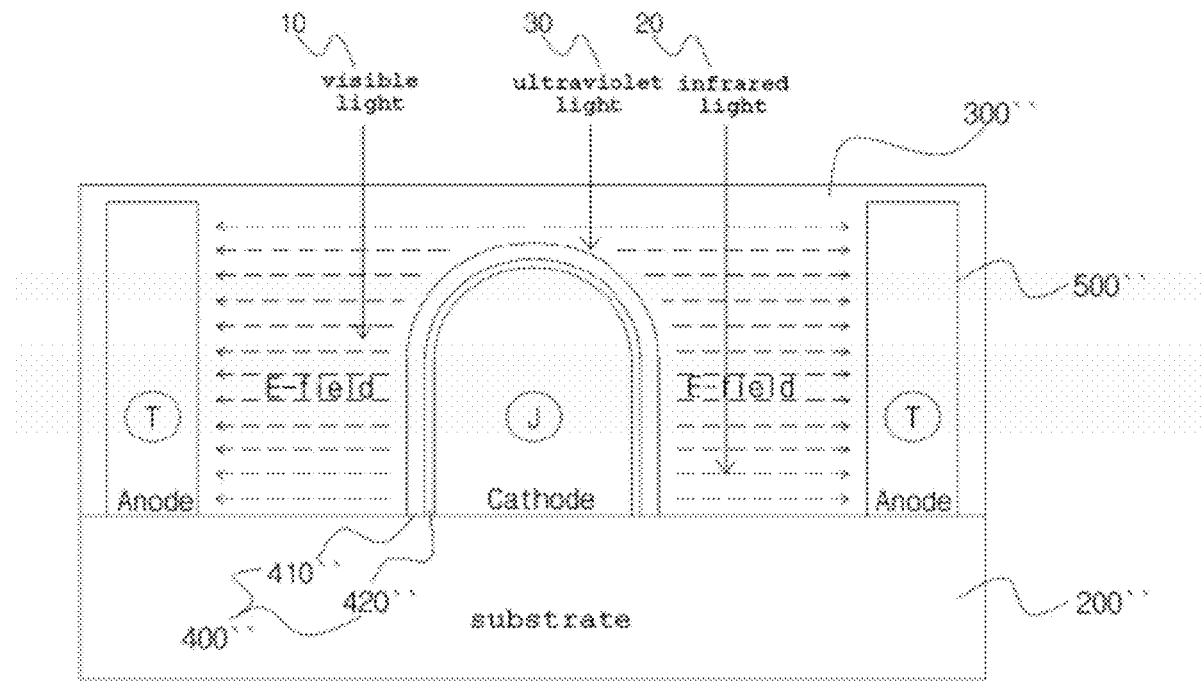
FIG. 5 is a cross-sectional view illustrating a third embodiment of a micro-pixel included in a vertical silicon photomultiplier according to an exemplary embodiment of the present invention.

FIG. 4 is a cross-sectional view illustrating a second embodiment of a micro-pixel included in a vertical silicon photomultiplier according to an exemplary embodiment of the present invention. FIG. 5 is a cross-sectional view illustrating a third embodiment of a micro-pixel included in a vertical silicon photomultiplier according to the present invention. Referring to FIGS. 3 to 5, the PN-junction layer may be implemented to be one of a rectangular V-letter shape 400, bar shape 400', and U-letter shape 400". If the PN-junction layer is vertically formed in the V-letter shape 400, the rectangular bar shape 400' and U-letter shape 400", in the epitaxial layer 300 of the micro-pixel 600, electric fields can be generated between the PN-junction layer 400 and the trench electrode 500. If the PN-junction layer 400 is formed in the V-letter shape 400 and U-letter shape 400" in the epitaxial layer 300 of the micro-pixel 600, although the visible light 10, infrared light 20 and ultraviolet light 30 are transmitted to the conductive layer with different depths, they can reach the PN-junction layer 400. Therefore, the quantum efficiency is increased. In order to form the PN-junction layer, the trench is vertically etched as being in the rectangular bar shape, U-letter shape, or V-letter shape, and then the PN-junction layer is formed on the trench sides.

Referring to FIGS. 3 to 5, the PN-junction layer may be 10 μm high. In that case, the PN-junction layer can absorb visible light 10, ultraviolet light 30, and infrared light 20. Although the infrared light 20 is transmitted to a relatively deep depth in the silicon, it can react to electric fields of the PN-junction layer formed in 10 μm deep.

Referring to FIGS. 3 to 5, the trench electrode 500 can be formed by depositing metal. After a trench is formed around the vertical PN-junction layer, metal is deposited into the trench, thereby forming the trench electrode 500. For example, a trench is formed around the vertical PN-junction layer 10 μm thick and metal is deposited in the trench. Through this process, a trench electrode is formed. When a reverse bias is applied to between the trench electrode 500 and the vertical PN-junction layer, electric fields are horizontally generated. Therefore, incident light transmitted into the silicon can react to the horizontally generated electric fields, irrespective of the transmission depth.

Figure 6:
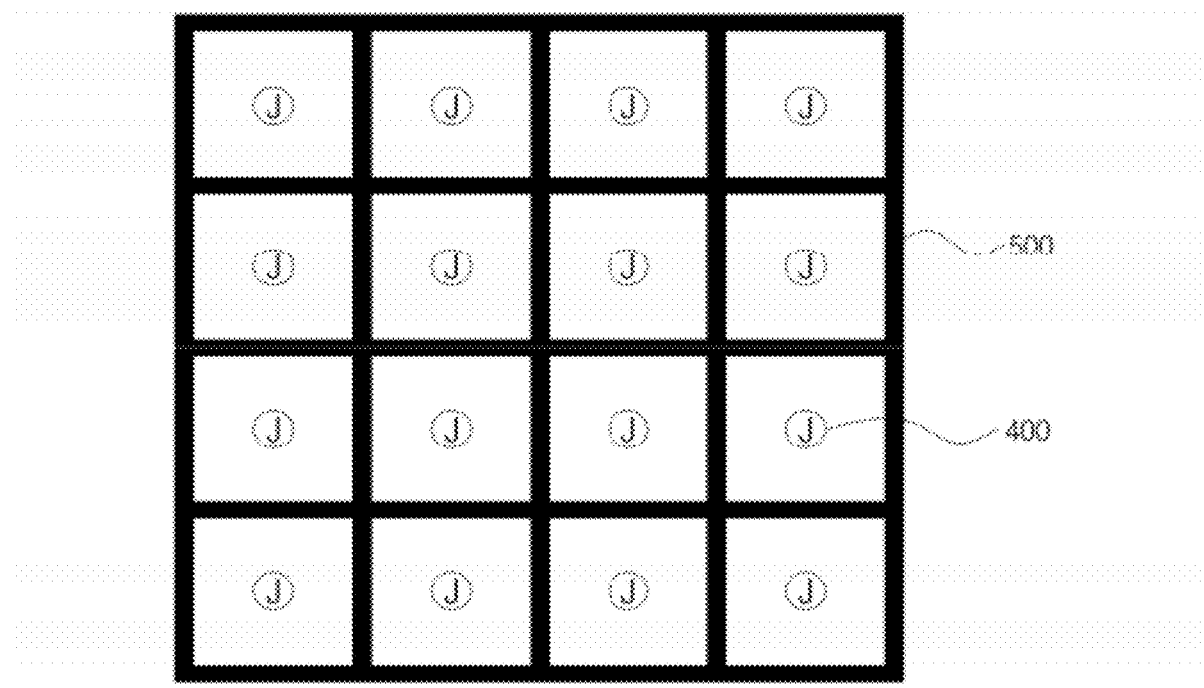
FIG. 6 is a cross-sectional view illustrating a first embodiment of an arrangement of a trench electrode included in a vertical silicon photomultiplier according to an exemplary embodiment of the present invention.
Figure 7:
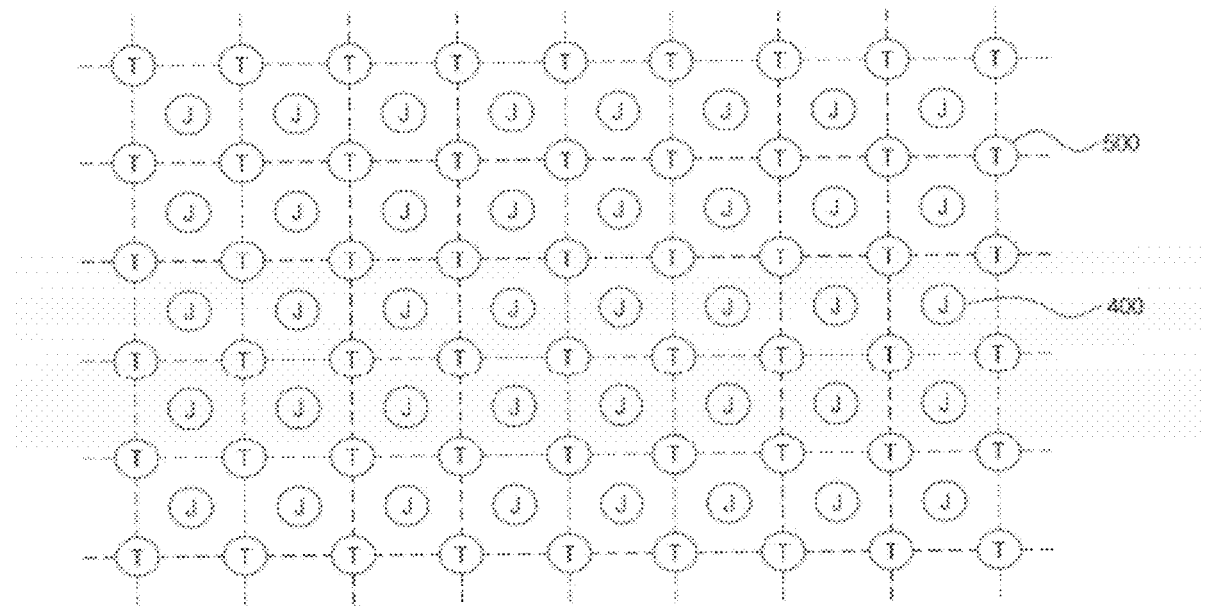
FIG. 7 is a cross-sectional view illustrating a second embodiment of an arrangement of a trench electrode included in a vertical silicon photomultiplier according to an exemplary embodiment of the present invention.
Figure 8:
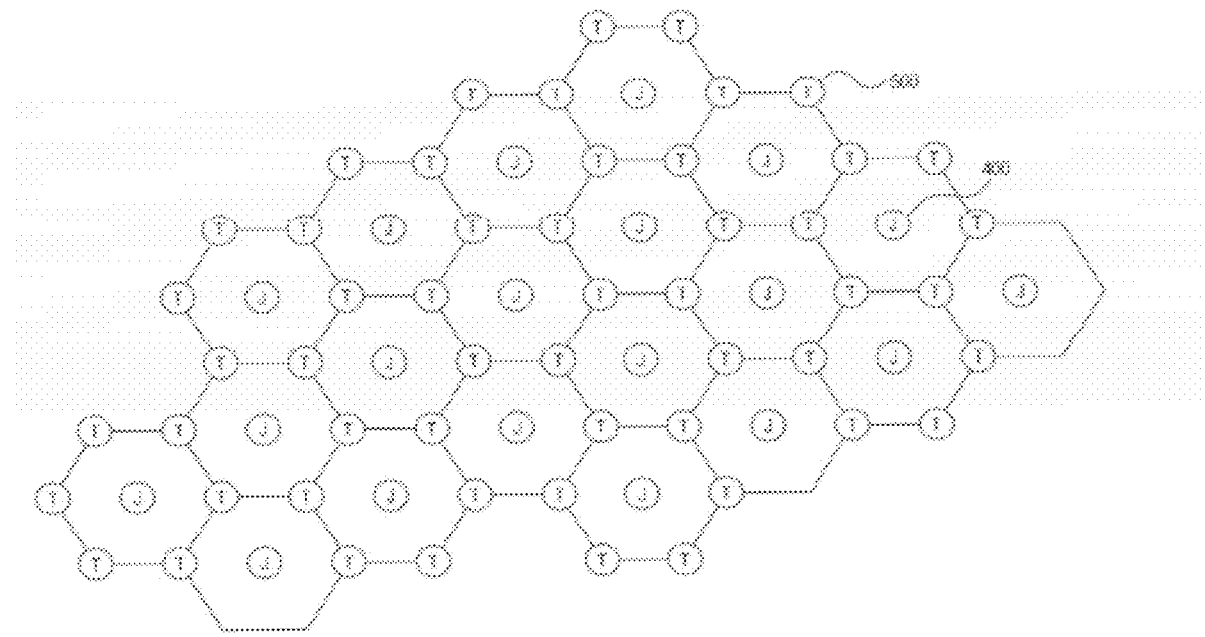
FIG. 8 is a cross-sectional view illustrating a third embodiment of an arrangement of a trench electrode included in a vertical silicon photomultiplier according to an exemplary embodiment of the present invention.

FIG. 6 is a cross-sectional view illustrating a first embodiment of an arrangement of a trench electrode included in a vertical silicon photomultiplier according to an exemplary embodiment of the present invention. FIG. 7 is a cross-sectional view illustrating a second embodiment of an arrangement of a trench electrode included in a vertical silicon photomultiplier according to the present invention. FIG. 8 is a cross-sectional view illustrating a third embodiment of an arrangement of a trench electrode included in a vertical silicon photomultiplier according to the present invention. Referring to FIGS. 6 to 8, the trench electrode 500 may be arrayed around the micro-pixel 600 in one of a square surrounding strip, a square edge, and a hexagonal edge. The trench electrode 500 is arrayed around the micro-pixel 600 including the PN-junction layer. When a reverse bias is applied between the trench electrode 500 and the PN-junction layer 400 is perpendicular to the trench electrode 500, electric fields are horizontally generated therebetween. Referring to FIG. 6, the trench electrode 500 can be formed in such a way that a trench is formed in a square shape around the micro-pixel 600 and then metal is deposited in the trench. Referring to FIG. 7, the trench electrode 500 can be formed in such a way that a trench is formed in only the edge of the square around the micro-pixel 600 and then metal is deposited in the trench. As shown in FIG. 8, the trench electrode 500 can be formed in such a way that a trench is formed in only the edge of the hexagon around the micro-pixel 600 and then metal is deposited in the trench. According to the shapes of the trench electrode 500 arrayed around the micro-pixel 600, the voltage can be controlled and the intensity or the flux shape of electric fields, generated between the PN-junction layer and the trench electrode, can also be controlled.

Referring to FIGS. 6 to 8, the trench electrode 500 may be 10~13 μm high. The vertical PN-junction layer 400 of a depth of 10 μm is formed in the epitaxial layer reacting to incident light. The trench electrode 500 of a depth of 10~13 μm is formed around the PN-junction layer. When a reverse bias is applied to the trench electrode and the PN-junction layer, electric fields are generated. If the trench electrode 500 is approximately 10 μm the same as the PN-junction layer 400 or 13 μm higher than the PN-junction layer 400, the reverse bias, applied to between the PN-junction layer 400 and the trench electrode 500, may generate uniform horizontal electric fields therebetween.

As described above, the vertical silicon photomultiplier according to the present invention includes a trench electrode and a PN-junction layer perpendicular to the trench electrode forms and can maximize the quantum efficiency at optical wavelengths, 200~900 nm in such a way that: it generates electric fields horizontal thereto, by applying a reverse bias voltage to between the trench electrode and the PN-junction layer, so that, although ultraviolet light does not reach the PN-junction layer but is incident on the surface, electron-hole pairs can be produced by the horizontally generated electric fields although and an avalanche breakdown can be thus generated; and it allows ultraviolet light, capable of being transmitted to a relatively deep depth, to react with the PN-junction layer.

While the invention has been shown and described with reference to certain exemplary embodiments thereof, it will be understood by those skilled in the art that various changes in form and details may be made therein without departing from the spirit and scope of the of the invention as defined in the appended claims and their equivalents.

What is claimed is:

1. A vertical silicon photomultiplier with superior quantum efficiency at optical wavelengths, comprising:
   a plurality of micro-pixels operated in a Geiger mode;
   a trench electrode placed around the micro-pixels; and
   a substrate on which the micro-pixels and the trench electrode are placed and part of which is exposed to an external environment and allows the plurality of micro-pixels and the trench electrode to be connected to the external environment,
   wherein a reverse bias voltage is applied between the trench electrode and the micro-pixels and horizontal electric fields are generated therebetween, and
   wherein the micro-pixels comprise a p-type conductive epitaxial layer.

2. The vertical silicon photomultiplier according to claim 1, wherein the micro-pixels further comprise
   a PN-junction layer vertically formed in the p-type conductive epitaxial layer.

3. The vertical silicon photomultiplier according to claim 2, wherein the PN junction layer comprises:
   a p-type conductive layer; and
   an n+-type conductive layer placed outside the p-type conductive layer.

4. The vertical silicon photomultiplier according to claim 2, wherein the n+-type conductive layer is thicker by 2 μm than the p-type conductive layer.

5. The vertical silicon photomultiplier according to claim 2, wherein the PN junction layer is formed as one of a rectangular bar shape, a U-letter shape, and a V letter shape.

6. The vertical silicon photomultiplier according to claim 2, wherein the PN junction layer is 10 μm high.

7. The vertical silicon photomultiplier according to claim 1, wherein the trench electrode is formed by depositing metal.

8. The vertical silicon photomultiplier according to claim 1, wherein the trench electrode is shaped in one of a square surrounding strip, a square edge, and a hexagonal edge.

9. The vertical silicon photomultiplier according to claim 1, wherein the trench electrode is 10~13 μm high.

10. The vertical silicon photomultiplier according to claim 1, wherein the p-type conductive epitaxial layer encloses the micro-pixels and the trench electrode.

11. The vertical silicon photomultiplier according to claim 1, wherein the micro-pixels extend perpendicularly from the substrate.

* * * * *